(12) United States Patent
Dick

(10) Patent No.: US 6,353,922 B1
(45) Date of Patent: Mar. 5, 2002

(54) AUTOMATIC GENERATION OF ONE DIMENSIONAL DATA COMPACTION COMMANDS FOR ELECTRON BEAM LITHOGRAPHY

(75) Inventor: Gregory J. Dick, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/382,107

(22) Filed: Aug. 24, 1999

(51) Int. Cl.[7] ................. G06F 7/60; G06F 17/10; G06F 19/00; G03F 9/00; G21K 5/10
(52) U.S. Cl. ................. 716/21; 716/8; 716/9; 716/19; 250/491.1; 250/491.2; 250/491.3; 250/491.22; 430/5; 700/121
(58) Field of Search ................. 716/21, 8, 9, 19; 430/5; 700/121; 250/494.1, 491.2, 491.3, 491.22

(56) References Cited

U.S. PATENT DOCUMENTS

| 5,159,201 A | * | 10/1992 | Frei | 250/492.2 |
| 5,428,552 A | * | 6/1995 | Rudert, Jr. et al. | 716/21 |
| 5,432,714 A | * | 7/1995 | Chung | 250/492.2 |
| 5,481,472 A | | 1/1996 | Chung et al. | 716/21 |
| 5,699,266 A | | 12/1997 | Chung et al. | 716/21 |
| 5,745,363 A | * | 4/1998 | Rostoker et al. | 700/121 |
| 5,815,403 A | * | 9/1998 | Jones et al. | 716/9 |
| 5,914,887 A | * | 6/1999 | Scepanovic | 716/8 |
| 6,174,630 B1 | * | 1/2001 | Petranovic | 430/5 |

* cited by examiner

Primary Examiner—Matthew Smith
Assistant Examiner—Jibreel Speight
(74) Attorney, Agent, or Firm—Eric W. Petraske

(57) ABSTRACT

A method, and a system for employing the method, for compacting the amount of memory required to store a two dimensional array of exposure spot shapes in a numerically controlled (NC) electron beam lithography tool. The method includes the steps of: sorting the shapes in a selected line based on the widths and heights of the shapes; identifying and removing from contention a group of shapes in the selected line having common widths and heights; determining a dosage requirement for the shapes in the group; and applying one or more commands based on the group and the determined dosed requirement to enable the NC electron beam lithography tool to draw the two dimensional array of exposure spot shapes. Before the sorting step, the method can include initially selecting whether processing for the shapes is performed on a vertical line or on a horizontal line basis; and applying the sorting step, the identifying step, the determining step and the applying step on a basis not selected in the initially selecting step. The method can also include the steps of: preselecting a minimum number of required common shapes; and performing the identifying and removing step only if the number of shapes in the group equals or exceeds the minimum number.

5 Claims, 4 Drawing Sheets

| | 202 | 204 | 206 | 208 | 210 | 212 |
|---|---|---|---|---|---|---|
| 102 | SHAPE 1 | $X_1$ | $Y_1$ | $H_1$ | $W_1$ | $DOSE_1$ |
| 104 | SHAPE 2 | $X_2$ | $Y_2$ | $H_2$ | $W_2$ | $DOSE_2$ |
| 106 | SHAPE 3 | $X_3$ | $Y_3$ | $H_3$ | $W_3$ | $DOSE_3$ |
| 108 | SHAPE 4 | $X_4$ | $Y_4$ | $H_4$ | $W_4$ | $DOSE_4$ |
| 110 | SHAPE 5 | $X_5$ | $Y_5$ | $H_5$ | $W_5$ | $DOSE_5$ |
| 112 | SHAPE 6 | $X_6$ | $Y_6$ | $H_6$ | $W_6$ | $DOSE_6$ |

AUTOMATIC GENERATION OF ONE DIMENSIONAL DATA COMPACTION COMMANDS FOR ELECTRON BEAM LITHOGRAPHY

BACKGROUND OF THE INVENTION

1. Field of the Invention

The following invention relates generally to electron beam lithography and specifically to data compaction commands used in electron beam lithography.

2. Related Art

Many manufacturing processes include a significant number of repeated sequences of actions. Particularly in the semiconductor industry, a particular pattern of more or less high complexity will be reproduced many times on the same wafer by a step-and-repeat procedure. While such a step-and-repeat process often involves an exposure of a sensitized surface to radiation with the pattern established by a mask, the same type of operation could readily be performed by a direct write operation using light (e.g. from a laser) or an electron beam. In this latter case, the amount of data required for reproduction of the entire pattern (or a portion thereof since more than one pattern could contribute to the entire final pattern) by repetitions of a basic pattern is reduced by an amount equal to the product of the number of repetitions of the pattern and the amount of data required to describe the basic pattern, usually leading to significant data reductions.

In modem semiconductor integrated circuit manufacturing processes, lithographic techniques are often employed to develop patterns which will form the various circuit elements of an integrated circuit and connections between them. While a plurality of chips may be formed on a wafer by a step and repeat exposure for each chip or each portion thereof at the chip level, desired patterns of the chip, itself, are often formed by dissection of the pattern into abutting elemental areas, predominantly rectangular in shape, and using an automated exposure tool to form each elemental shape in a high-speed sequence of individual exposures in response to numerical control data (NCdata).

However, as integrated circuits have become more complex and constructed at higher densities and smaller feature sizes, the number of such elemental areas has become very large, often requiring hundreds of thousands if not millions of exposures. In the past, this number of elemental areas was often reduced to more manageable numbers by limiting proximity correction (exposure correction for the exposure "dose" an area may receive due to certain imperfections in the exposure system such as secondary emission and other electron scattering effects in electron beam lithography exposure tools) and assigning a common dose to many contiguous elemental areas which can then be produced by a plurality of step and repeat operations at the same dose in order to form a continuous shape. In such a case, the step and repeat operations can be directly defined from shape length and can be assumed without detection if the rectangle has a dimension greater than an optimum spot size (maxspot) of the tool.

A further complicating factor, particularly in regard to e-beam tools is the fact that materials which are sensitive to e-beam exposure will exhibit "blooming", if overexposed; causing loss of precision in the location of edges of the pattern. Therefore, even though shapes may be repeated with great regularity in some patterns, it is likely that individual spots in any sequence of spots will require different exposure doses and thus cannot be produced by a regular step-and-repeat procedure.

While it is desirable to "saturate" or fully expose resist or other exposure-sensitive materials to obtain full contrast for the pattern but recognizing the tendency of such materials to exhibit "blooming" if overexposed, a proximity correction system and methodology has been developed, as previously disclosed in U.S. Pat. No. 5,432,714, filed Jan. 29, 1993, by Stuart et al., which is assigned to the assignee of the present invention and fully incorporated by reference herein. This technique compensates for the potential for overexposure of areas due to secondary emission and scattering effects in e-beam tools from neighboring exposed areas of the pattern (referred to as proximity correction) so that elemental areas can be correctly exposed (e.g. fully proximity corrected to any desired degree of exposure accuracy) while still maintaining the volume of data to a minmimum. This technique, however, because of the greater exposure accuracy provided, increases the number of rectangles (e.g. each rectangle being composed of one or more elemental rectangular areas having the same computed exposure dose) over the prior, less accurate techniques of limited proximity correction in which simplifying assumptions are employed to limit the data volume.

This increase in the number of areas receiving different doses infers a similar increase in the number of rectangle descriptions and a decrease in the number of contiguous step-and-repeat operations possible at the same dose. Also, improved accuracy of proximity correction during tiling or filling of areas, such as near the borders of pads and conductor runs in the vicinity of pads, under stringent design rules, implies a likelihood of similar elemental area exposures which are not contiguous at a particular exposure dose and for which no efficient or effective detection or data compaction technique currently exists. Accordingly, the problem of manipulation of a great quantity of data with sufficient speed to control an exposure tool with throughput sufficient to a manufacturing application remains very difficult.

Regardless of how the final pattern is ultimately achieved, a basic pattern must be formed. In present-day integrated circuits of high complexity and integration density an initial layout pattern for a mask or other physical pattern to be produced is preferably directly written into a resist coating on a wafer or other material from which a mask is to be formed by a tool such as an electron beam lithography exposure apparatus, hereinafter referred to as an e-beam tool (or, more generally, "exposure tool"). Whether the exposure is by an electron beam or other form of energy, the exposure tool directs such energy at high speed to a long sequence of very small areas on the surface to be exposed under automated control and thus builds up a pattern from a large plurality of exposed (generally rectangular) spots. These spots will be located in accordance with the design of the pattern and also have particular addresses corresponding to a corner, center or other location in accordance with some convention. Otherwise, the spots must be considered as being randomly located for generality of reproducible patterns.

In view of the complexity of present-day integrated circuits, a basic pattern may include tens or hundreds of millions of such exposure spots. Therefore, while the description of such spots may be relatively simple in comparison with even a simple basic pattern, the number of spots to be exposed constitutes an enormous volume of data for each pattern. When it is considered that each byte of such data must be transferred to at least one register in order to control the exposure tool and that such transfer requires a finite amount of time, it can be understood that the volume of data needed to define a basic pattern can easily cause a substantial amount of processor overhead unless some data compaction is possible. The amount of storage required for a list of the exposure spots often limited the number of patterns which may be cost-effectively stored in memory of an automated exposure tool.

To overcome these problems relating to the volume of required data, processor overhead, and limitations on the number of patterns that can be cost-effectively stored in the memory of an automated exposure tool, methods for automatically recognizing repeated shapes for data compaction and data compression were developed, as previously disclosed in U.S. Pat. Nos. 5,481,472, filed May 18, 1993, and 5,699,266, filed May 1, 1995, both by Chung et al., which are assigned to the assignee of the present invention and fully incorporated by reference herein.

These methods assume the data to be quite jumbled, and that consecutive candidates for the step function will have different dosage requirements (i.e., the dosage of radiation required for the consecutive data patterns will be quite different). This assumption is not necessarily valid, and may place the dosage requirement on too high a priority. Another disadvantage is that these algorithms work in one direction, or will look for step candidates in either the X direction or the Y direction, but not both. If the wrong dimension is guessed by a process or user, central processing unit (CPU) time may be wasted. If a design has step candidate arrays in both dimensions, only the steps in the single dimension chosen are pursued.

SUMMARY OF THE INVENTION

The present invention is directed to a method, and a system for employing the method, for compacting the amount of memory required to store a two dimensional array of exposure spot shapes in a numerically controlled (NC) electron beam lithography tool. The method includes the steps of: sorting the shapes in a selected line based on the widths and heights of the shapes; identifying and removing from contention a group of shapes in the selected line having common widths and heights; determining a dosage requirement for the shapes in the group; and applying one or more commands based on the group and the determined dosage requirement to enable the NC electron beam lithography tool to draw the two dimensional array of exposure spot shapes.

In one embodiment, before the sorting step, the method includes initially selecting whether processing for the shapes is performed on a vertical line or on a horizontal line basis; and applying the sorting step, the identifying step, the determining step and the applying step on a basis not selected in the initially selecting step.

In one embodiment, the method also includes the steps of: preselecting a minimum number of required common shapes; and performing the identifying and removing step only if the number of shapes in the group equals or exceeds the minimum number.

The applying step can include the step of applying a single shape command for the shapes in the group. The applying step can include the step of applying a single step command specifying that the single shape command must be repeated based on the number of shapes in the group. The applying step can also include the step of applying one or more dosemerge commands based on the doseage requirement.

BRIEF DESCRIPTION OF THE FIGURES

The present invention will be described with reference to the accompanying drawings, wherein:

FIG. 2 illustrates how shapes (or exposure spots) can be stored as an array in an electron beam tool memory;

FIG. 4 illustrates a larger two dimensional layout of shapes used to describe the present invention.

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

Figure 1:
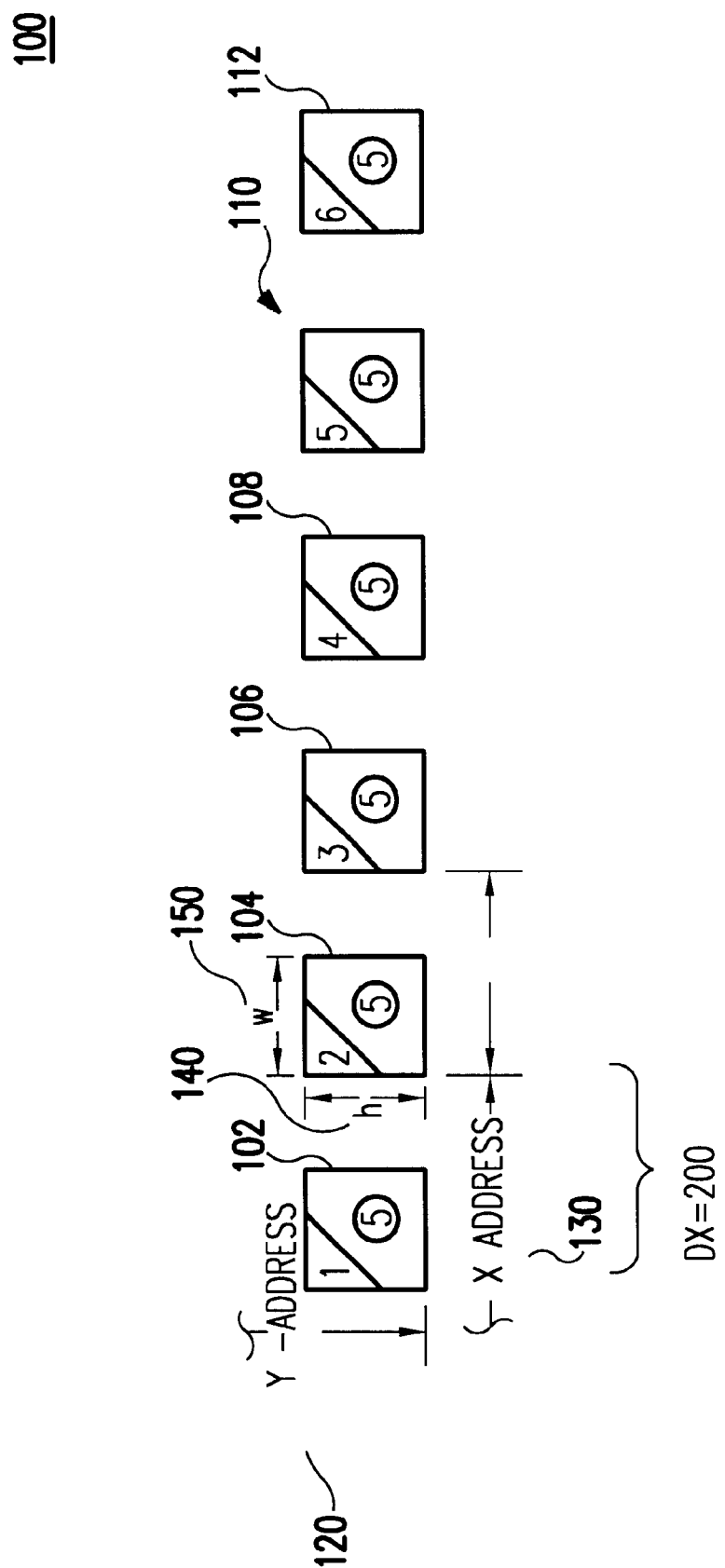
FIG. 1 illustrates an exemplary one-dimensional sequence of shapes (or exposure spots)

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The present invention is directed to a technique that saves tool storage memory for a lithography tool. The lithography tool can be a numerically controlled (NC) tool, receiving NC commands for its implementation. An example embodiment will serve to facilitate an understanding.

In electron beam lithography, an electron beam is shot onto a semiconductor mask with photosensitive resist material on it. When the electron beam hits portions of the mask, these portions are worn away, and a design pattern is thereby drawn on the chip. These patterns, or shapes, are therefore exposure spots. It is these shapes that comprise the elements of the chip, such as transistors.

The mask can comprise a variety of different materials, such as silicon dioxide, chrome-on-glass (COG), X-ray standard mask, or National Institute of Standards and Technology (NIST) standard mask. When the electron beams hits, the photosensitive resist is worn away, and a hole extending to the substrate material over which the mask sits (such as glass) is created.

There are a variety of different Computer Aided Design (CAD) tools for designing the pattern followed by the electron beam (e-beam), to make the masks. Examples include the MEBES tool (from Etec Corporation, Haywood, Calif.); optical tools (of various manufacturers); the ELX family of tools, from International Business Machines). MEBES uses a fixed e-beam spot, while tools like the ELX allow for variable sized e-beam spots. The e-beam is increasingly small (narrow) in diameter, down to approximately 70 nanometers, and decreasing in size to date, to permit more and more circuit elements on a chip.

The problem is that as the chip designs are becoming more and more complex, and the basic line sizes (the size of e-beam lines made on masks) are getting smaller, the data files used to run the e-beam lithography tools are becoming quite large. The Semiconductor Industry Association (SIA) Road Map predicts that data files on the order of 512 gigabytes will be required for a 16 gigabit chip design.

The purpose of the invention is to reduce the amount of memory required to feed the lithography design tools. This is performed by reducing the redundancies in the size of the design shapes, and further, by changing the prioritization of commands used by the tools. The following is a detailed description of how this is implemented.

Referring now to the drawings, and more particularly to FIG. 1, there is shown a one-dimensional sequence of shapes (or exposure spots) 100. Sequence 100 includes shapes 102, 104, 106, 108, 110 and 112. Each shape, for example shape 104, has a height dimension 140 and a width dimension 150. In addition, each shape has a relative y-position 120 (or y-address) on the mask. The delta between x-positions is 200.

In addition, each shape has a dosage amount 160, representing the amount of e-beam dosage required for the entire shape. The e-beam dosage is symbolically represented by a circle in the middle of each shape. For convenience, shapes 102, 104, 106, 108, 110 and 112 are sequentially numbered (in the top left corners of the shapes) 1, 2, 3, 4, 5 and 6.

The reason for applying different dosages to different shapes is as follows. When the e-beam is shot at the shape on the mask, the e-beam has a tendency to scatter because the electrons repel one another, causing a spray of electrons versus a straight line of electrons. In addition, due to the proximity of the electrons to one another (caused by the repelling), once the electrons hit the substrate, they have a tendency to bounce around. To correct for this proximity effect, the dosages of adjacent shapes are made to be different from one another. The dosage is applied using a dosemerge command, as described below.

As apparent from viewing the shapes, the heights 140, widths 150, and dosages 160 of all 6 shapes are the exact same. Consequently, the e-beam tool may store the same exact height 140, width 150 and dosage 160 for all 6 shapes to compact the total amount of information it must store. The only information that must be stored uniquely for shapes 102–110 are the respective locations, represented by their respective x-positions starting at 130 and having a delta x of 200. As illustrated, shapes 102–112 have the same y-positions, on a horizontal line.

FIG. 2 illustrates how shapes 102–112 can be stored as an array in the e-beam tool memory 200. Illustrated therein are a shape identification field 202, an x-position field 204, a y-position field 206, a height position field 208, a width position field 210 and a dosage field 212. For 6 shapes, there are 36 unique pieces of information before data compaction is applied, calculated from 6 shapes ×6 fields per shape. If the data is compacted to account for the fact that the height field 208, the width field 210 and the dosage field 212 are common, the amount of stored information is significantly reduced. The total unique data required is 8 derived by adding 6 fields identifying the first shape (width, height, x-position, y-position, shape identification, dosage) and (2) 2 fields identifying the step command (delta x between shapes+the number of shapes to step).

Figure 3:
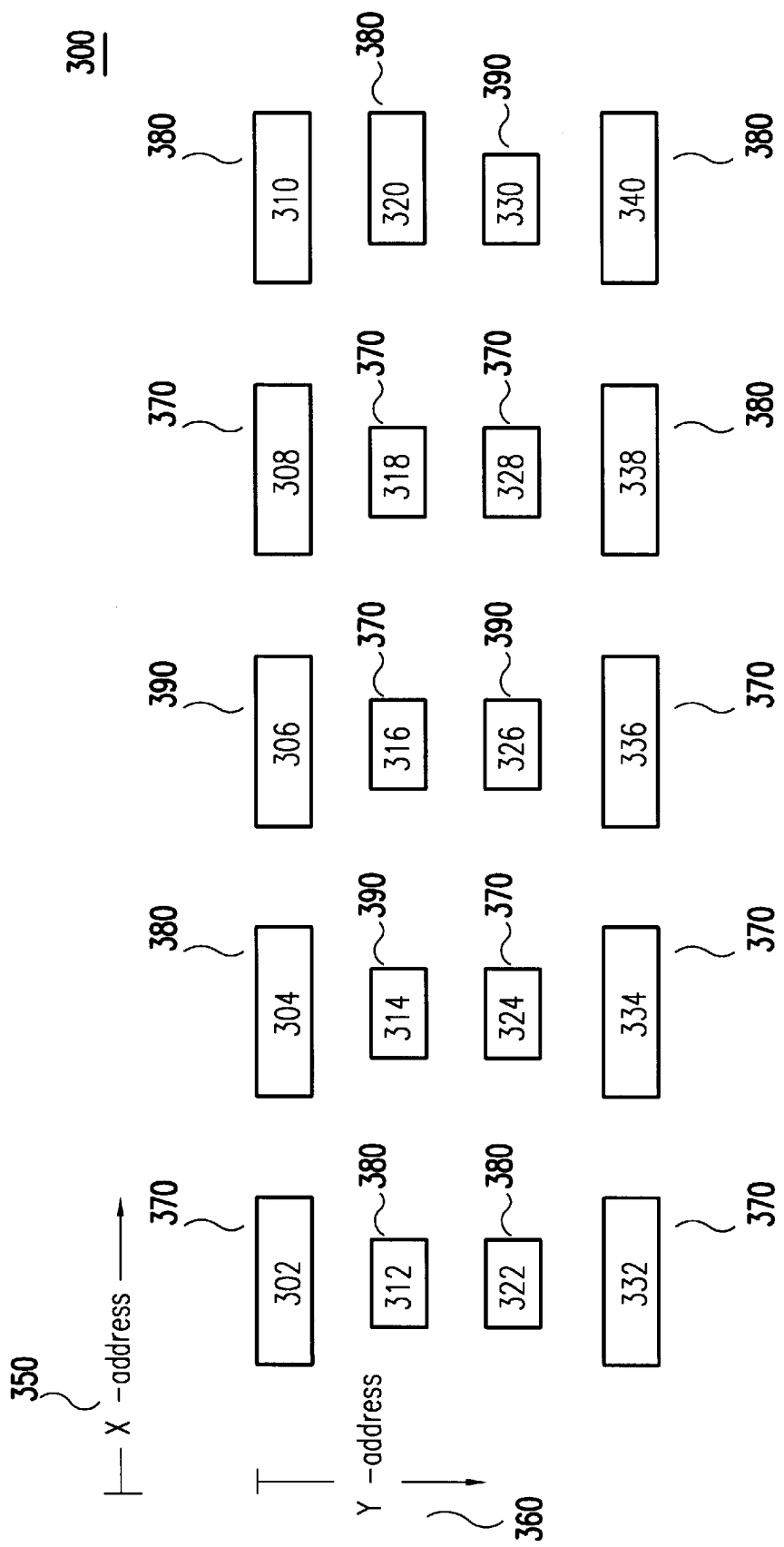
FIG. 3 illustrates a two dimensional lay out of shapes used to describe the present invention.

FIG. 3 illustrates a two dimensional lay out of shapes 300. Two dimensional lay out 300 includes a plurality of shapes laid out in two dimensions (the x and y directions). Included are shapes 302,304,306,308,310, 312,314,316, 318,320,322, 324,326,328,330, 332,334,336,338 and 340. Shapes 302, 304, 306, 308 and 310 have a common y-position, shapes 312, 314, 316 and 318 and 320 have a common y-position, shapes 322, 324, 326, 328 and 330 have a common y-position, and shapes 332, 334, 336, 338 and 340 have a common y-position.

There are other commonalities between shapes 302–340 as well, for which data can also be compacted. Shapes 302–310 and shapes 332–340 have the same widths 150 and heights 140. Shapes 312–318 and shapes 322–330 also have the same widths 150 and heights 140.

The dosages requirements for the shapes are also illustrated. Shapes 302,308,316,318,324, 328,332,334 and 336 have a dosage requirement symbolically labeled 370. Shapes 304,310,312, 320,322,338 and 340 have a dosage requirement symbolically labeled 380. Shapes 306, 314, 326 and 330 have a dosage requirement symbolically labeled 390.

One embodiment will illustrate how data compaction can be performed. In this embodiment, a type of e-beam tool having shape commands, dosemerge commands, and step commands is used.

Shape commands are used to enter the width and height of a shape. For each shape, either or both of the width and height of a shape can be changed.

Step commands are used to enter the number of times to repeat the shape command. It is possible to change the x-position and y-position for each step command. However, only one dimension can be changed in each step command. In other words, either the x-position can be changed, or the y-position can be changed, but not both at the same time.

Dosemerge commands are used to enter the level of e-beam dosage required for each shape. The dosages can be applied differently to adjacent shapes to prevent the proximity effect.

A compaction algorithm can be applied to conserve the amount of data stored by the NC e-beam lithography tool. The shapes are processed in a type of numerical order.

The specific dimensions of each shape can be sorted. This can be performed by sorting the shapes based on the widths and heights of each shape. For example, the shapes can be processed in order of ascending widths and ascending heights.

The shapes are also sorted based on the relative x-position and relative y-position of the shapes. This too can be based on an ascending or descending basis. For the same x-position, a single step command can be issued for the same shape. Similarly, for the same y-position, a single step command can be issued for the same shape.

The doses are also sorted for the issuance of a dosemerge command. This too can be based on an ascending or descending basis. Each shape has a unique dosage. But a single dosemerge command is issued to change the dosage when necessary.

In addition, a minimum number of similar shapes can be specified for data compaction to occur. For example, a user can specify that at least four shapes having the same width and height on the same row (or column) must be found before the compaction algorithm works. The compaction algorithm works by forcing the shape command to be issued once (for the width and height of the shape), followed by a step command indicating that the shape command must be repeated for the like shapes. Referring to FIG. 3 for example, a single shape command can be issued for shape 302, followed by a step command specifying to repeat the shape command 4 times for shapes 304–310.

The above does not explain how the dosemerge command comes into play. In previous methods, along the same row (having similar x-position) or the same column (having the same y-position), sorting was based on shapes having the same width, height, and dosage requirement. Referring to FIG. 3, along the same x-position, shapes 332, 334 and 336 have the same dosage requirement of 370, and shapes 338, 340 have the same dosage requirement of 380.

With these previous methods of common assignee, the algorithm would check the width, height, and dosage of each shape, then look for the next shape having the exact same width, height and dosage, in its algorithm. This means that first shape 332 is selected based on its width, height, and doseage requirement. Next, the width, height, and doseage requirement of 334 is taken into account. Then it is determined that shapes 332 and 334 have the width, height and doseage requirement parameters in common. The same processing is performed for shapes 336, 338, and 340, to determine commonality between the three parameters. This has been found to be somewhat wasteful, because it assumes that there is a great number of changes in dosage requirements between adjacently processed shapes.

In the present invention, however, the algorithm identifies the common shapes based on the width and height parameters first, and then views the dosage amounts for the identified group of shapes. For example, in the same line, shapes 332, 334 would be identified as having a common width and height dimension. Then the dosage requirements for these shapes are viewed to determine whether the dosemerge command needs to be applied. Next, shapes 336–340 are identified as having a common width and height dimension. Then the dosage requirements for these shapes are viewed to determine whether the dosemerge command needs to be applied for these shapes. The savings in memory is great where the width, height, and dosage data is not greatly jumbled.

The following is a description of how all the shapes of two dimensional lay out 300 are processed in one embodiment, in light of the above. (An exemplary algorithm described in pseudocode is provided below.) The sorting is done exhaustively, so that once repetitions are found between shapes, the shapes are removed from contention.

First, it is determined whether the sorting is to be done vertically or horizontally. This feature was not provided in previous systems of common assignee as the present invention. In other words, it is determined whether the sorting for each horizontal line (having common y-position) is done first, or whether the sorting for each vertical line (having common x-position) is done first. Sorting for the remaining direction is performed after it is performed for the first direction. In the present example, sorting is completed on a horizontal line (row) basis first.

Second, the sorting for each line is performed based on ascending widths and heights for all of the shapes of that line. Beginning with the first horizontal line (shapes having the first y-position), since shapes 302–310 have the same width and height dimensions, they can be processed sequentially from left to right. Next, in the second horizontal line (shapes having the second y-position), since shapes 312–318 have the same width and height dimensions, they can be processed sequentially from left to right, followed by shape 320, which is larger. Next, in the third horizontal line (shapes having the third y-position), since shapes 322–330 have the same width and height dimensions, they can be processed sequentially from left to right. Finally, in the fourth horizontal line (shapes having the fourth y-position), since shapes 332–340 have the same width and height dimensions, they can be processed sequentially from left to right as well.

After line-based sorting, for each line, shapes having common width and height dimensions, where the number of common shapes is over a preset minimum are identified. For example, suppose the preset minimum number of common shapes is 4. In the first horizontal line, shapes 302–310 (which are 5 in number, greater than the preset number of 4) are identified, have a step command created, and removed from contention. In the second horizontal line, shapes 312–318 are identified and removed from contention. In the third horizontal line, shapes 322–330 are identified and removed from contention. In the fourth horizontal line, shapes 332–340 are identified and removed from contention.

However, either before (or even after) the processor moves onto sort a next line for common shapes, it is determined whether the dosemerge command should be issued for common shape groups. For example, in the first horizontal line, the dosemerge command must be issued to set and change the doseage requirement for each of shapes 302–310, because each of these shapes has a different doseage requirement. On the other hand, in the fourth horizontal line, the dosemerge command must be issued to set or change the doseage requirement only for shape 332 and shape 338. The reason is that once the doseage is set for shape 332, it remains constant for shapes 334 and 336, and once the doseage is set for shape 338, it remains constant as well for shape 340.

The above-described algorithm provides that for shapes 302–310, a single shape command is issued (for the common width and height dimensions),one dosemerge command (with 5 doseages) is issued and a single step command is issued (for repetition of the shape command four additional times). This represents a significant reduction in memory requirements for the NC e-bearn lithography tool. Similar memory savings are provided for all four lines. For example, for the fourth horizontal line, a single shape command is issued, a dosemerge command (with 2 doseages) is issued, and a step command is issued (for repetition of the shape command four additional times).

After horizontal sort processing is completed, all shapes are removed from contention except for shape 320. That is, for all other shapes, at least four shapes of common dimensions have been found, whereas shape 320 is the only shape of its particular width.

After horizontal sort processing, vertical sort processing is applied. Since only a single shape (shape 320) remains, there are no matches on the vertical axis that would result in memory compaction. Shape 320 has a normal shape command (6 fields including identifying the first shape (width, height, x-position, y-position, shape identification, dosage) issued for it.

Figure 4:
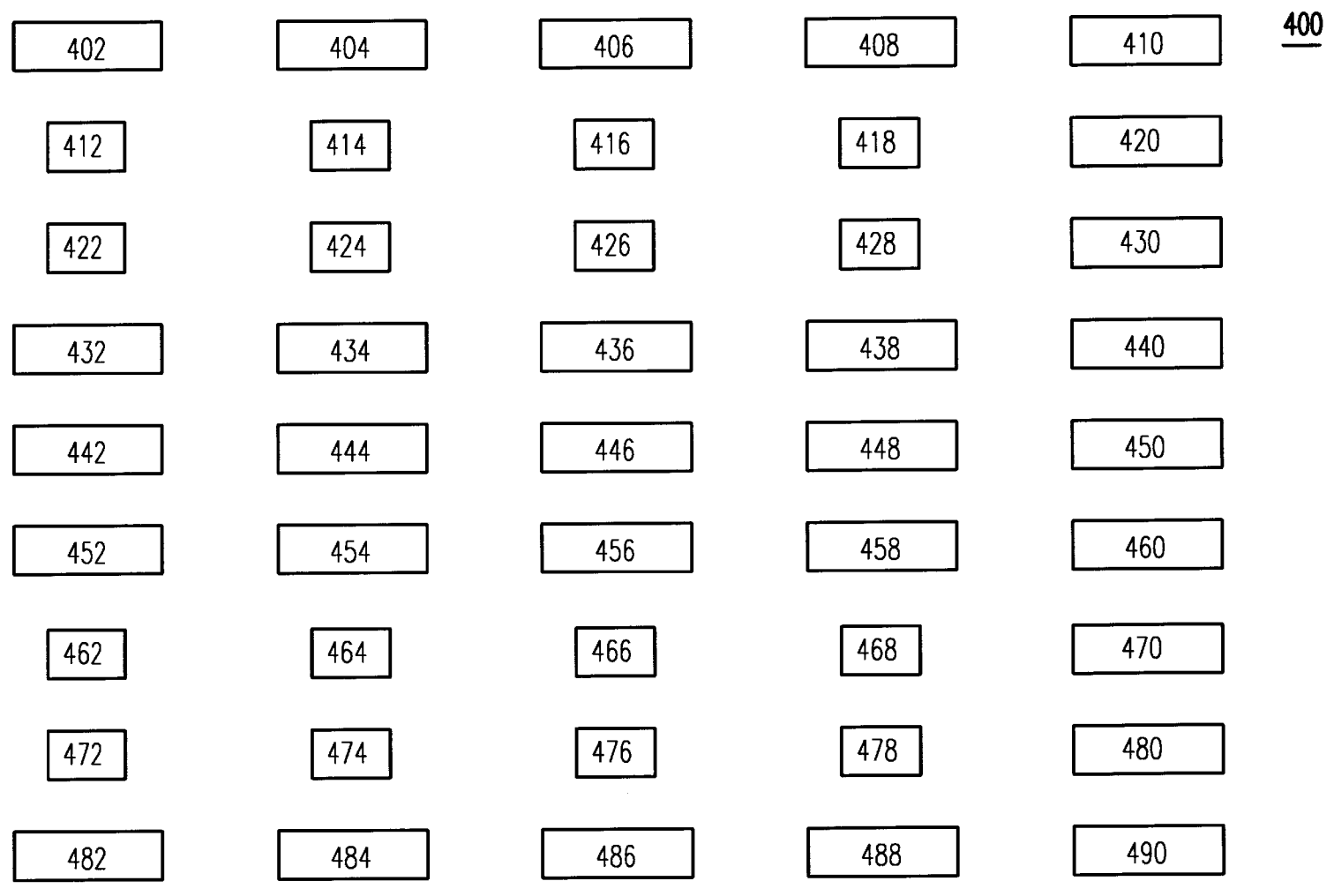

FIG. 4 illustrates a larger two dimensional layout of shapes 400. Suppose horizontal processing is applied first to layout 400. The above-described processing would create step commands and then remove the following groups of shapes from contention: (1) shapes 402–408 from the first horizontal line; (2) shapes 412–418 from the second horizontal line; (3) shapes 422–428 from the third horizontal line; (4) shapes 432–438 from the fourth horizontal line; (5) shapes 442–448 from the fifth horizontal line; (6) shapes 452–458 from the sixth horizontal line; (7) shapes 462–468 from the seventh horizontal line; (8) shapes 472–478 from the eighth horizontal line; and (9) shapes 482–488 from the ninth horizontal line.

After horizontal processing is performed, vertical processing is begun. In vertical processing, the above-described processing (for horizontal lines) is performed on a column (or vertical line) basis. Since shapes 402–408,412–418, 422–428,432–438,442–448,452–458,462–468,472–478 and 482–488 are removed from contention, only the last vertical line remains. This last vertical line contains shapes 410,420, 430,440,450, 460,470,480 and 490. The above-described algorithm is applied to this last vertical column to identify these shapes as having common width and height dimensions. The doseage requirement is then determined for this group. After the algorithm is run to determine compaction, a single shape command (for the common width and height requirement) is issued, a dosemerge command (with the appropriate number of doseages) is issued, and a singe step command (for repetition of the shape command eight additional times) is issued.

The following algorithm uses pseudocode to describe the above-described embodiment of the present invention.

```
BEGIN ALGORITHM
If search_for_step_in_x_first
    do
        Search_for_steps_in_x( );
        Search_for_steps_in_y( );
    enddo
else
        Search_for_steps_in_y( );
        Search_for_steps_in_x( );
search_for_steps_in_x:
    sort "left to right"
    Point to the first shape
    set accumulation_count to 1
    set search_width to the first shape's width
    set search_height to the first shape's height
    set search_y to the first shape's y
    set search_x to the first shape's x
    set dx, dy to 0
    do for all shapes
    point to the current shape
    if current_shape's width = search_width and
        Current_shape's height = search_height and
        Current_shape's y = search_y then
        /* same shape, same y location */
        Do
            If accumulation_count = 1 then
                Do
                    Set current_dx = current_shape's x − prev_x
                    Set prev_x to current shape's x
                    Accumulation_count++;
                Enddo
            Else
                Do
                    If current_shape's.x − prev_x = current_dx then
                        Do
                            Accumulation_count++;
                            Prev_x = current_shape.x
                        Enddo
                    Else
                        /* same shape, different dx */
                        Set end_of_accumulation_switch
            Enddo
        Enddo
    Else
        /* different shape or different y */
        Set end_of_accumulation_switch
    if end_of_accumulation_switch then
        Do
            If accumulation_count > minimum needed then
                Do
                    Create step command from the first shape until one
                    before the current shape
                    Remove the stepped shapes from further search
                    Set the first shape to be the current shape
                    Reset current_shape width, height, y
                    Reset accumulation_count to 1
                Enddo /* enough for a step command */
        Enddo /* end_of_accumulation_switch set */
    endfor /* for all shapes */
    end search_for_steps_in_x
```

-continued

```
END ALGORITHM
```

While the invention has been particularly shown and described with reference to preferred embodiments thereof, it will be understood by those skilled in the relevant art that various changes in form and details may be made therein without departing from the spirit and scope of the invention.

What is claimed is:

1. A method for compacting the amount of memory required to store a two dimensional array of exposure spot shapes arrayed in at least two lines in a first direction and in at least two lines in a second direction at right angles to said first direction in a numerically controlled (NC) electron beam lithography tool, comprising the steps of:

For each of said at least two lines in said first direction;
  (a) sorting the shapes in a selected line in said first direction based on the widths and heights of the shapes;
  (b) identifying and removing from contention at least one group of shapes in said selected line having common widths and heights;
  (c) determining a doseage requirement for said shapes in said group;
  (d) applying one or more commands based on said group and said determined doseage requirement to enable the NC electron beam lithography tool to draw said two dimensional array of exposure spot shapes; and For each of said at least two lines in said second direction;
  repeating steps (a) through (d) in a second direction for shapes that have not been removed from contention in a first execution of steps (a) through (d) in said first direction, whereby shapes in said first and second directions are compacted and each shape is removed from contention after being identified in one group.

2. A method according to claim 1, further comprising the steps of:
preselecting a minimum number of required common shapes; and
performing said identifying and removing step only if the number of shapes in said group equals or exceeds said minimum number.

3. A method according to claim 1, wherein said applying step comprises the step of:
applying a single shape command for said shapes in said group.

4. A method according to claim 3, wherein said applying step comprises the step of:
applying a single step command specifying that said single shape command must be repeated based on the number of shapes in said group.

5. A method according to claim 1, wherein said applying step comprises the step of:
applying a dosemerge command based on said doseage requirement.

* * * * *